United States Patent
Farrow et al.

(10) Patent No.: US 6,945,314 B2
(45) Date of Patent: Sep. 20, 2005

(54) MINIMAL FLUID FORCED CONVECTIVE HEAT SINK FOR HIGH POWER COMPUTERS

(75) Inventors: Timothy Samuel Farrow, Apex, NC (US); Michael Sean June, Raleigh, NC (US); Albert Vincent Makley, Raleigh, NC (US)

(73) Assignee: Lenovo PTE LTD, Singapore (SG)

( * ) Notice: Subject to any disclaimer, the term of this patent is extended or adjusted under 35 U.S.C. 154(b) by 0 days.

(21) Appl. No.: 10/745,039

(22) Filed: Dec. 22, 2003

(65) Prior Publication Data

US 2005/0133203 A1    Jun. 23, 2005

(51) Int. Cl.[7] ............................................. F28F 5/00
(52) U.S. Cl. ............................ 165/80.3; 165/104.31; 165/86
(58) Field of Search ..................... 165/80.3, 80.4, 165/104.28, 104.31, 104.33, 86; 361/698

(56) References Cited

U.S. PATENT DOCUMENTS

| | | | |
|---|---|---|---|
| 3,999,400 A * | 12/1976 | Gray | 165/86 |
| 5,119,886 A * | 6/1992 | Fletcher et al. | 165/86 |
| 5,295,533 A * | 3/1994 | Ueno | 165/86 |
| 5,384,687 A * | 1/1995 | Sano | 165/80.4 |
| 5,441,102 A * | 8/1995 | Burward-Hoy | 165/104.33 |
| 6,019,165 A * | 2/2000 | Batchelder | 165/80.3 |
| 6,419,009 B1 | 7/2002 | Gregory | 165/151 |
| 6,532,748 B1 * | 3/2003 | Yuan et al. | 165/86 |
| 6,543,522 B1 | 4/2003 | Hegde | 165/80.3 |
| 6,578,625 B1 | 6/2003 | Wyatt et al. | 165/80.3 |
| 6,580,610 B2 * | 6/2003 | Morris et al. | 165/80.4 |
| 6,668,911 B2 * | 12/2003 | Bingler | 165/80.4 |
| 2002/0121362 A1 | 9/2002 | Gregory | 165/148 |
| 2003/0056939 A1 * | 3/2003 | Chu et al. | 165/80.4 |
| 2004/0042176 A1 * | 3/2004 | Niwatsukino et al. | 165/80.4 |

FOREIGN PATENT DOCUMENTS

JP            10132310         5/1998         ............ F24F 1/00

* cited by examiner

*Primary Examiner*—Teresa J. Walberg
(74) *Attorney, Agent, or Firm*—Scott W. Reid; John L. Rogitz

(57) ABSTRACT

A heat removal system for a computer has a heat sink and a spool rotatably disposed in the heat sink. The spool includes fluid inlets and outlets, and water circulates in a closed loop from the inlets, through the spool, through the outlets, past the computer component to be cooled, and between the heat sink and the spool to transfer heat to the heat sink, then back to the inlets. A thermally conductive can is between the heat sink and spool such that the working fluid flows between the can and spool.

34 Claims, 2 Drawing Sheets

MINIMAL FLUID FORCED CONVECTIVE HEAT SINK FOR HIGH POWER COMPUTERS

FIELD OF THE INVENTION

The present invention relates generally to heat removal in computers.

BACKGROUND OF THE INVENTION

As personal computers become ever more powerful, they tend to generate larger amounts of waste heat that must be removed at low cost to the manufacturer. Currently, most personal computers have heat sinks that conduct heat from components such as the processor of the computer to the air inside the computer chassis, with a fan circulating air across the heat sink.

More heat removal capability might be required than can be provided with a fan. As understood by the present invention, the heat removal capacity of a circulating fluid heat removal device is limited by the viscosity of the working fluid and the thermal resistance between the component sought to be cooled and the air. Furthermore, existing working fluid systems typically are expensive, require internal piping, etc. Still further, existing fan-based systems that blow air across fins underuse the portions of the fins that are furthest away from the component being cooled, thereby failing to fully exploit the heat removal capacity of the heat sink. Having recognized the above need to increase the heat removal capacity of a PC and the attendant current drawbacks to address the need, the present invention is provided.

SUMMARY OF THE INVENTION

In accordance with embodiments of the present invention, a heat removal system is provided for a computer that includes a component to be cooled. The heat removal system includes a heat sink and a spool rotatably disposed in the heat sink. The spool includes working fluid inlets and working fluid outlets, and working fluid (such as water) circulates in a closed loop from the inlets, through the spool, through the outlets, past the component to be cooled, and between the heat sink and the spool to transfer heat to the heat sink, then back to the inlet.

Preferably, the computer includes a fan blowing air past the heat sink. When the heat sink is an axial flow heat sink, the fan and spool can be rotated by a common motor. In contrast, when the heat sink is a transverse flow heat sink, the fan and spool can be rotated by respective motors.

In the preferred embodiment a thermally conductive can is between the heat sink and spool. The working fluid flows between the can and spool, with the can being in thermal contact with the heat sink. The can may be thin, wherein most heat from the component is first convected away by the circulating water and then conducted through the can to the heat sink. Or, the can may be relatively thick (e.g., between one half millimeter and two millimeters), wherein heat from the hot component is conducted directly through the can to the portions of the heat sink fins that are near the component, and wherein heat from the hot component is also convected away by the water for conduction through the can to the portions of the heat sink fins that are distanced from the component, thereby enhancing the efficiency of the heat sink.

The preferred non-limiting spool includes a hollow housing defining the inlet and outlet, and a working fluid guiding member disposed in the housing and rotating therewith. The working fluid guiding member channels working fluid from the inlet to the outlet as the housing rotates. A cap covers the end of the housing to seal the can. In the particularly preferred embodiment, the working fluid guiding member includes an outer guiding element defining at least one convex channel portion and an inner guiding element nested in the outer guiding element and defining at least one concave channel portion mating with the convex channel portion of the outer guiding element to define a working fluid channel extending from the inlet to the outlet.

In another aspect, a spool for a computer which includes a fan and a component to be cooled includes a housing rotatably disposable in a heat sink in the computer. The housing includes at least one heat exchange liquid inlet and at least one heat exchange liquid outlet. When the housing is rotated in the heat sink, heat exchange liquid circulates in a closed loop from the inlet, through the housing, through the outlet, past the component to be cooled, and between the heat sink and the housing to transfer heat to the heat sink, and back to the inlet.

In yet another aspect, a computer includes a component to be cooled, a heat sink disposed to absorb heat from the component, and a fan blowing air past the heat sink. A spool is rotatably disposed in the heat sink to circulate coolant adjacent the component and heat sink to transfer heat from the component to the heat sink.

The details of the present invention, both as to its structure and operation, can best be understood in reference to the accompanying drawings, in which like reference numerals refer to like parts, and in which:

DETAILED DESCRIPTION OF THE PREFERRED EMBODIMENT

Figure 1:
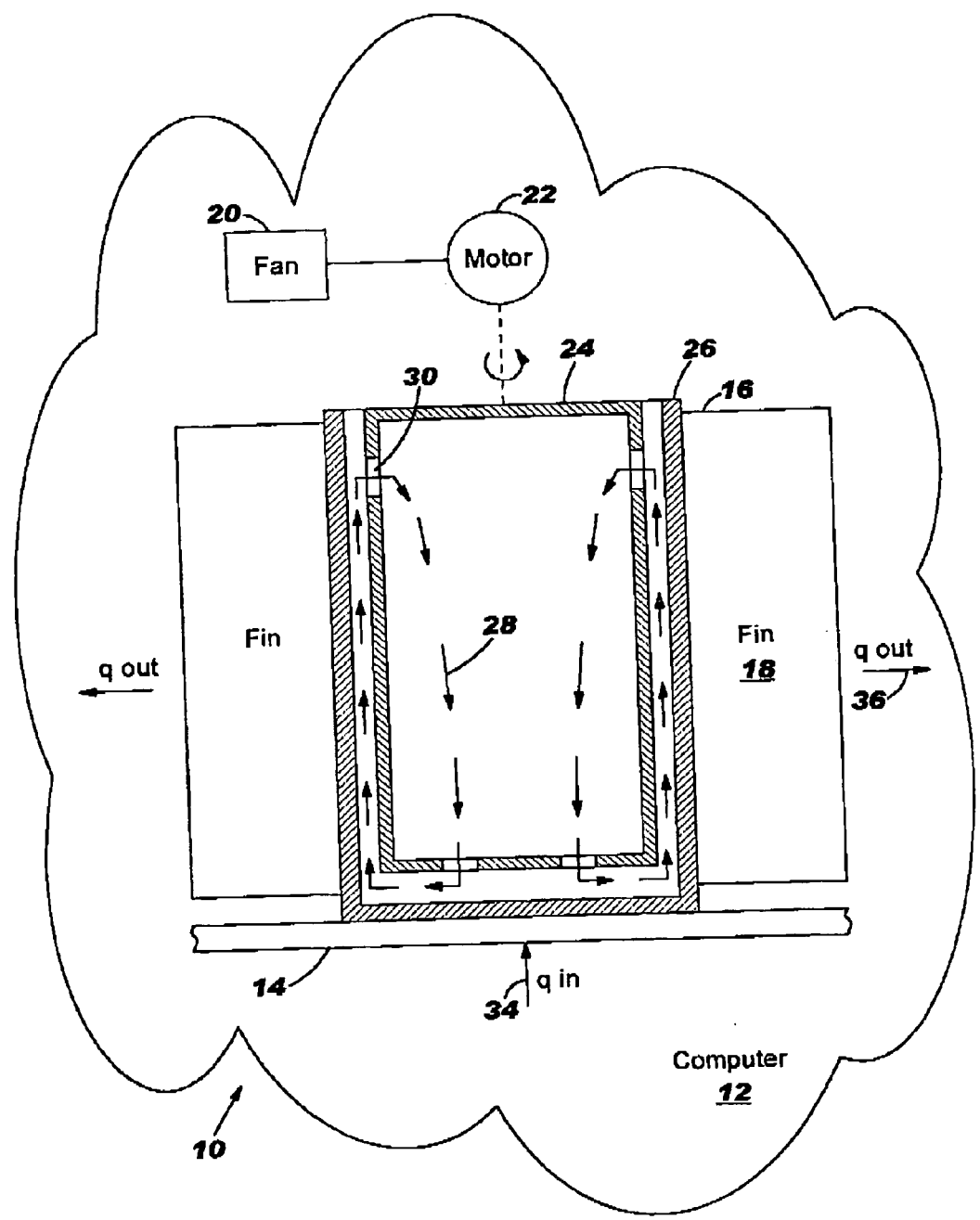
FIG. 1 is a partial cross-sectional diagram of the present spool engaged with the heat sink, showing the motor and fan schematically.

Referring initially to FIG. 1, a heat removal system is shown and generally designated 10 for a computer 12 that includes a component or components 14 to be cooled, such as a processor chip. As shown, the system 10 includes one or more heat sinks 16 each of which preferably is a fin-type heat sink that has plural thin metal plates, or fins, 18. In the preferred embodiment a fan 20 that is driven by a motor 22 blows air past the fins 18.

In accordance with the present invention, a spool 24 is rotatably disposed in the heat sink 16. When the heat sink 16 is an axial flow heat sink, the fan 20 and spool 24 may be rotated by a common motor 22, as indicated by the line from the motor 22 to the spool 24 indicating a mechanical or magnetic coupling. On the other hand, when the heat sink 16 is a transverse flow heat sink, the fan 20 and spool 24 are rotated by respective motors. In either case, the motor or motors may be controlled as appropriate by the computer 12 to establish a desired temperature.

A thermally conductive can 26, such as a metal can, e.g., made of Copper, preferably is disposed between the heat sink 16 and spool 24. With this in mind, a working fluid such as a liquid, e.g., water (indicated by the arrows 28 in FIG. 1) flows between the can 26 and spool 24 as shown, with the can 26 being in thermal contact with the heat sink 16. Accordingly, when the spool rotates within the heat sink, the working fluid is caused to circulate in a closed loop from an inlet or inlets 30 of the spool 24, through the interior of the spool 24 as more fully discussed below, through an outlet or outlets 32 of the spool 24, past the component 14 to be cooled, and between the heat sink 16 and the spool 24 to transfer heat to the heat sink 16, prior to flowing back to the inlet 30. In this way, heat (denoted "$q_{in}$" in FIG. 1) is transferred into the working fluid as shown by the arrow 34, with heat being removed from the working fluid/heat sink combination ("$q_{out}$") as indicated by the arrows 36.

As can be appreciated in reference to FIG. 1, the volume of working fluid used in the system is minimized by the dimensions of the spool 24 and the close spacing of the spool 26 from the can 26. This reduces the pumping power that is required.

When the can 26 is relatively thin, e.g., less than one-half of one millimeter, most of the heat transfer relies on the working fluid to transfer heat throughout the plane of passage between the spool and heat sink fins 18. On the other hand, the can 26 can be made relatively thick if desired, e.g., between one half millimeter and two millimeters thick. In the latter case heat transfer to the portions of the fins 18 nearest the component 14 to be cooled is dominated by heat being conducted directly from the component 14 through the can 26, while heat transfer to the portions of the fins 18 furthest from the component 14 to be cooled is dominated by heat picked up by the working fluid from the component 14 and convected upward for ultimate conduction through the can 26 to the fins 18, thereby increasing overall fin efficiency in dissipating heat.

Figure 2:
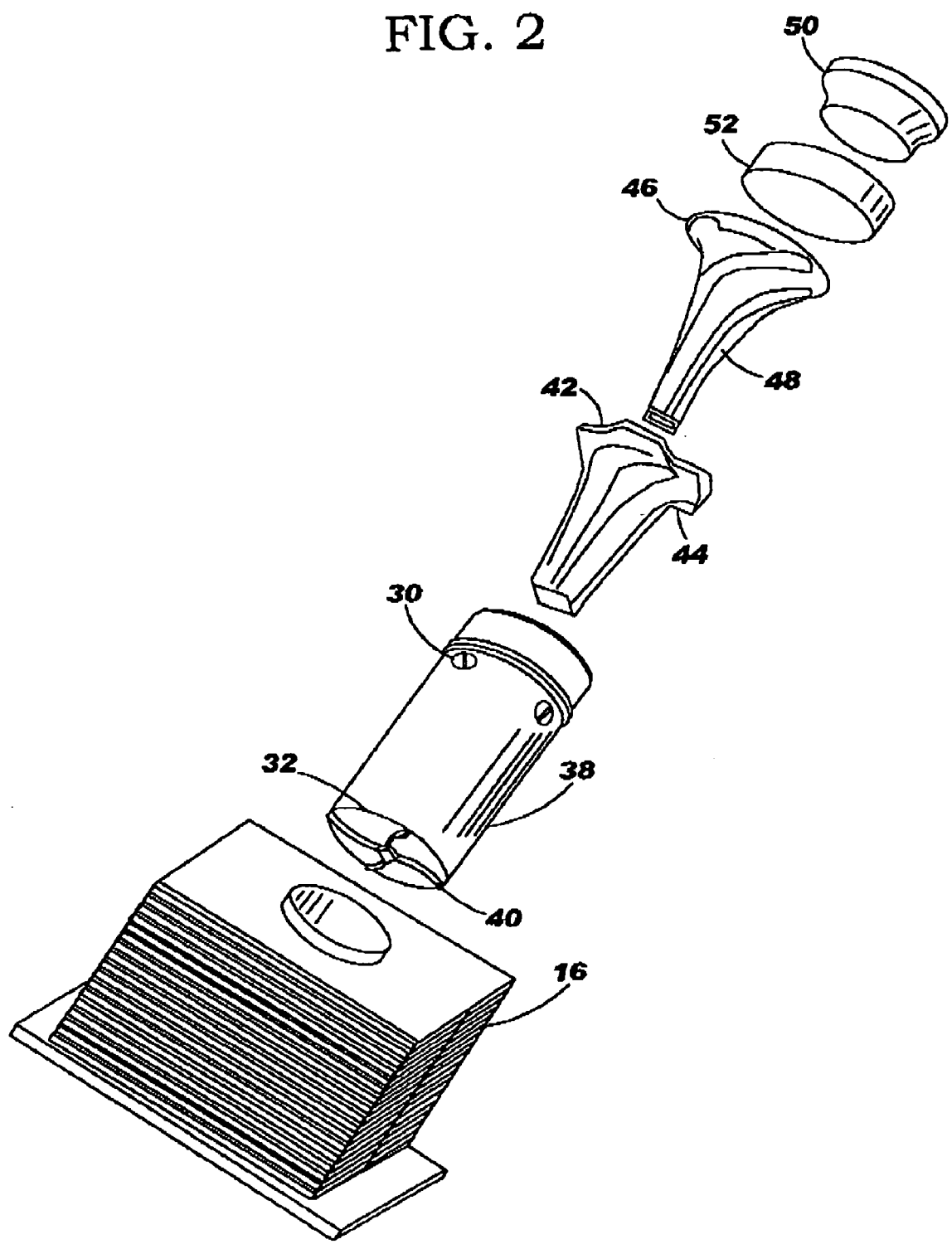
FIG. 2 is an exploded view of the spool assembly.

FIG. 2 shows a preferred implementation of the spool 24. As shown, the spool 24 can include a hollow preferably cylindrical plastic housing 38. The housing 38 can be formed with the inlets 30 and outlets 32. In the preferred embodiment shown, the housing 38 is formed with four equidistantly spaced outlets 32 arranged around the bottom of the housing 38 and four equidistantly spaced inlets 30 arranged around an upper periphery of the housing 38. Thus, the inlets 30 are radially outward of the outlets 32. The inlets 30 are scoop-shaped as shown to promote fluid inflow. The outlets 32 are configured as shown such that as fluid exits the outlets 32 that are rotating with the housing, the fluid impinges on the can to create a high force convective heat transfer coefficient.

Additionally, the preferred housing 38 is formed with plural, preferably four, vanes or impellers 40 on the bottom of the housing 38, i.e., the portion of the housing 38 that faces the component 14 to be cooled, shown in FIG. 1. As the spool 24 rotates, the vanes 40 disturb boundary layers in the working fluid flowing past the vanes to enhance the heat transfer of the system.

FIG. 2 shows that in the preferred embodiment, disposed inside the housing 38 and rotating therewith is an injection molded or extruded outer guiding element 42 that defines plural convex channel portions 44. The shape of the outer guiding element 42 is somewhat like that of a trumpet. Each channel portion 44 is oriented generally circumferentially relative to the element 42 adjacent the inlets 30, and then each channel bends downward to a generally axial orientation adjacent the outlets 32.

An inner guiding element 46 is configured complementarily to the outer guiding element 42 and is nested in the outer guiding element 42. The inner guiding element 46 defines concave channel portions 48, each of which mates with a respective convex channel portion 44 of the outer guiding element 42 to define a respective working fluid channel which extends from a respective inlet 30 to a respective outlet 32. Together, the elements 42, 46 establish a working fluid guiding member that channels working fluid from the inlets 30 to the outlets 32 as the spool 24 rotates within the heat sink 16.

Preferably, a cap 50 covers the end of the housing 38 that is opposite to the closed bottom to hermetically seal the can 26. A ring magnet 52 can be engaged with the cap 50 outside the fluid flow path to magnetically couple the housing 38 to the motor 22 shown in FIG. 1.

With the above structure, a single rotating element, i.e., the spool 24, pumps heat exchange fluid such as water in the manner described above to effect high forced convective heat transfer coefficients for the system 10. Single phase heat transfer is envisioned but dual phase can be used to extend performance. As mentioned above, minimal working fluid volume is required, reducing pump power requirements, and the can 26 is hermetically sealed. The wiping action of the vanes 40 disturbs fluid boundary layers, further enhancing heat transfer, and heat is spread relatively uniformly across the surface areas of the fins 18, improving heat sink efficiency. The system 10 results in a low cost, light weight system that can be used for both axial and transverse air flow heat sinks.

While the particular MINIMAL FLUID FORCED CONVECTIVE HEAT SINK FOR HIGH POWER COMPUTERS as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". It is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. §112, sixth paragraph, unless the element is expressly recited using the phrase "means for" or, in the case of a method claim, the element is recited as a "step" instead of an "act". Absent express definitions herein, claim terms are to be given all ordinary and accustomed meanings that are not irreconcilable with the present specification and file history.

We claim:

1. A heat removal system for a computer including at least one component to be cooled, comprising:
   a heat sink; and
   an elongated spool rotatably disposed in the heat sink, the spool including at least one working fluid inlet and at least one working fluid outlet, wherein working fluid circulates in a closed loop from the inlet, through the spool, through the outlet, past the component to be cooled, and between the heat sink and the spool to transfer heat to the heat sink, and back to the inlet.

2. The system of claim 1, wherein the working fluid is water.

3. The system of claim 1, wherein the computer includes at least one fan blowing air past the heat sink.

4. The system of claim 3, wherein the heat sink is an axial flow heat sink and the fan and spool are rotated by a common motor.

5. The system of claim 3, wherein the heat sink is a transverse flow heat sink and the fan and spool are rotated by respective motors.

6. The system of claim 1, further comprising a thermally conductive can between the heat sink and spool, the working fluid flowing between the can and spool, the can being in thermal contact with the heat sink.

7. The system of claim 6, wherein the can has a thickness of between one half millimeter and two millimeters.

8. The system of claim 6, wherein the spool includes:
a hollow housing defining the inlet and outlet;
a working fluid guiding member disposed in the housing and rotating therewith, the working fluid guiding member channeling working fluid from the inlet to the outlet as the housing rotates; and
a cap covering an end of the housing to seal the can.

9. The system of claim 8, wherein the housing defines at least one vane adjacent the component to be cooled to disturb boundary layers in the working fluid to promote heat transfer.

10. The system of claim 8, wherein the inlet is scoop-shaped.

11. The system of claim 8, wherein the working fluid guiding member includes an outer guiding element defining at least one convex channel portion and an inner guiding element nested in the outer guiding element and defining at least one concave channel portion mating with the convex channel portion of the outer guiding element to define a working fluid channel extending from the inlet to the outlet.

12. The system of claim 11, wherein the housing defines plural inlets and plural outlets, the working fluid guiding member defining plural channels, each channel extending between a respective inlet and a respective outlet.

13. The system of claim 11, wherein the working fluid channel is oriented generally circumferentially relative to the working fluid guiding member adjacent the inlet and generally axially relative to the working fluid guiding member adjacent the outlet.

14. The system of claim 13, wherein the outlet is radially inward of the inlet, relative to the working fluid guiding member.

15. A spool for a computer including at least one component to be cooled and a fan, comprising:
a housing rotatably disposable in a heat sink in the computer, the housing including at least one heat exchange liquid inlet and at least one heat exchange liquid outlet, wherein when the housing is rotated in the heat sink, heat exchange liquid circulates in a closed loop from the inlet, through the housing, through the outlet, past the component to be cooled, and between the heat sink and the housing to transfer heat to the heat sink, and back to the inlet.

16. The spool of claim 15, wherein the spool includes:
a heat exchange liquid guiding member disposed in the housing and rotating therewith, the heat exchange liquid guiding member channeling heat exchange liquid from the inlet to the outlet as the housing rotates; and
a cap covering an end of the housing.

17. The spool of claim 16, wherein the housing defines at least one vane adjacent the component to be cooled when the spool is disposed in the computer to disturb boundary layers in the heat exchange liquid to promote heat transfer.

18. The spool of claim 16, wherein the inlet is scoop-shaped.

19. The spool of claim 16, wherein the heat exchange liquid guiding member includes an outer guiding element defining at least one convex channel portion and an inner guiding element nested in the outer guiding element and defining at least one concave channel portion mating with the convex channel portion of the outer guiding element to define a heat exchange liquid channel extending from the inlet to the outlet.

20. The spool of claim 19, wherein the housing defines plural inlets and plural outlets, the heat exchange liquid guiding member defining a respective channel extending between a respective inlet and a respective outlet.

21. The spool of claim 19, wherein the heat exchange liquid channel is oriented generally circumferentially relative to the heat exchange liquid guiding member adjacent the inlet and generally axially relative to the heat exchange liquid guiding member adjacent the outlet.

22. The spool of claim 21, wherein the outlet is radially inward of the inlet, relative to the heat exchange liquid guiding member.

23. A computer, comprising:
at least one component to be cooled;
at least one heat sink disposed to absorb heat from the component;
at least one fan blowing air past the heat sink;
at least one spool rotatably disposed in the heat sink to circulate coolant adjacent the component and heat sink to transfer heat from the component to the heat sink; and
a thermally conductive can between the heat sink and spool, the water flowing between the can and spool, the can being in thermal contact with the heat sink.

24. The computer of claim 23, wherein the coolant is water.

25. The computer of claim 23, wherein the heat sink is an axial flow heat sink and the fan and spool are rotated by a common motor.

26. The computer of claim 23, wherein the heat sink is a transverse flow heat sink and the fan and spool are rotated by respective motors.

27. The computer of claim 23, wherein the can has a thickness of between one half millimeter and two millimeters.

28. A computer, comprising:
at least one component to be cooled;
at least one heat sink disposed to absorb heat from the component;
at least one fan blowing air past the heat sink; and
at least one spool rotatably disposed in the heat sink to circulate coolant adjacent the component and heat sink to transfer heat from the component to the heat sink, wherein the spool includes:
a hollow housing defining the inlet and outlet;
a water guiding member disposed in the housing and rotating therewith, the water guiding member channeling water from the inlet to the outlet as the housing rotates; and
a cap covering an end of the housing.

29. The computer of claim 28, wherein the housing defines at least one vane adjacent the component to be cooled to disturb boundary layers in the water to promote heat transfer.

30. The computer of claim 28, wherein the inlet is scoop-shaped.

31. The computer of claim 28, wherein the water guiding member includes an outer guiding element defining at least one convex channel portion and an inner guiding element nested in the outer guiding element and defining at least one concave channel portion mating with the convex channel portion of the outer guiding element to define a water channel extending from the inlet to the outlet.

32. The computer of claim 31, wherein the housing defines plural inlets and plural outlets, the water guiding member defining a respective channel extending between a respective inlet and a respective outlet.

33. The computer of claim 31, wherein the water channel is oriented generally circumferentially relative to the water guiding member adjacent the inlet and generally axially relative to the water guiding member adjacent the outlet.

34. The computer of claim 33, wherein the outlet is radially inward of the inlet, relative to the water guiding member.

* * * * *